United States Patent
Marr et al.

(10) Patent No.: US 7,613,979 B1
(45) Date of Patent: Nov. 3, 2009

(54) NETWORK COMMUNICATION PROTOCOL FOR LARGE SCALE DISTRIBUTION OF STREAMING CONTENT

(75) Inventors: James E. Marr, Burlingame, CA (US); Payton R. White, Foster City, CA (US); Attila Vass, Foster City, CA (US); Gary Zalewski, Oakland, CA (US)

(73) Assignee: Sony Computer Entertainment Inc., Tokyo (JP)

( * ) Notice: Subject to any disclaimer, the term of this patent is extended or adjusted under 35 U.S.C. 154(b) by 593 days.

(21) Appl. No.: 11/296,642

(22) Filed: Dec. 7, 2005

(51) Int. Cl.
*H03M 13/00* (2006.01)
*H04L 1/18* (2006.01)

(52) U.S. Cl. .................. 714/751; 370/401; 714/746

(58) Field of Classification Search .............. 714/751, 714/746; 370/401; 710/710
See application file for complete search history.

(56) References Cited

U.S. PATENT DOCUMENTS

| | | | |
|---|---|---|---|
| 6,307,487 B1 | 10/2001 | Luby | 341/50 |
| 6,532,562 B1 * | 3/2003 | Chou et al. | 714/776 |
| 6,728,777 B1 * | 4/2004 | Lee et al. | 709/238 |
| 7,249,291 B2 * | 7/2007 | Rasmussen et al. | 714/701 |
| 7,257,664 B2 * | 8/2007 | Zhang | 714/748 |
| 7,372,853 B2 * | 5/2008 | Sharma et al. | 370/390 |

OTHER PUBLICATIONS

U.S. Appl. No. 12/546,547, entitled "Network Communication Protocol for Large Scale Distribution of Streaming Content", filed Aug. 24, 20009.

* cited by examiner

*Primary Examiner*—Guy J Lamarre
*Assistant Examiner*—Sam Rizk
(74) *Attorney, Agent, or Firm*—Joshua D. Isenberg; JDI Patent

(57) ABSTRACT

Forward error correction may be implemented in a network having first, second and third nodes. The second node receives streaming media message packets and one or more check packets from an upstream first node. The second node transmits the message packets and check packets to a downstream third node. The second node uses the check packets to decode missing message packets and transmits the decoded missing packets to the third node before the missing message packets are to be presented by the third node. The third node may receive message packets and a first set of check packets from the second node and a second set of check packets from the first node. The third node may use check packets from both sets to decode missing message packets.

22 Claims, 3 Drawing Sheets

NETWORK COMMUNICATION PROTOCOL FOR LARGE SCALE DISTRIBUTION OF STREAMING CONTENT

FIELD OF THE INVENTION

This invention is related to network communication protocols for transmission of streaming media and more particularly to forward error correction in network transmission of streaming media.

BACKGROUND OF THE INVENTION

An application layer network multicast may use a tree-based topology. Several multicast trees may be wrapped around a ring-like network. For an application layer multicast each node in the network sends message packets from a publisher to one or more nodes downstream. The downstream nodes are referred to herein as children. By using a tree-based topology, the publisher doesn't need to send the message packets directly to all the recipients. When the message packets transmit streaming data, such as audio or video frames, a buffer at each node holds the frames of content before they are displayed on a screen as images or played through a speaker as sounds. Networks are generally less than perfectly reliable and some packets are typically lost in transmission between a node and its child or children. The lost packets create gaps in the feed of streaming media data. These gaps can result in abnormalities in the presentation of streaming media such as lost video frames, sound dropouts and the like.

Unfortunately, there can be unacceptable levels of packet loss in a network multicast of streaming data. This is due to the fact that errors (e.g., missing packets) may be generated at each level of nodes in the network. The errors, therefore, tend to accumulate as they propagate further along the tree. For example, consider a simple multicast tree where a publisher distributes messages to two first-level child nodes. Each of the two first-level child nodes, in turn each forwards the messages from the publisher to two second-level child nodes. Each of the second level child nodes forwards the messages from the first-level nodes to two third-level nodes and each third-level node passes these messages on to two fourth-level nodes. In this example there are thirty-one nodes in the tree, the publisher, two at the first level, four at the second level, eight at the third level and sixteen at the fourth level. If errors occur at each level at a certain rate, the error rate received from the level above is passed on to the level below. For example if errors occur at each level at a rate of 2%, those nodes at the first level receive errors at the 2% rate from the level above and additional errors occur at the first level a 2% rate. The first level nodes pass both (i.e., a 4% rate) to the second level. Similarly, the third level receives errors at a 6% rate and the fourth level receives an 8% rate. Thus, over half the nodes in the tree experience an 8% error rate.

Networks often use some form of forward error correction to fill in these gaps for static, i.e., non-streaming data. Forward error correction generally involves sending more information than is needed to fill the gaps. The forward error correction information is typically in the form of check packets. A downstream node receiving the check packets can generally lose any part of a file but still be able to reconstruct the whole file if enough check packets are received. The check packets are based on combinations of random message packets that have been logically combined through an operation such as a bit-wise Exclusive OR or XOR operation. Each bit in a check packet is the result of the XOR of one or more message packets. By way of example, in a bit-wise XOR operation between two digital messages bits in corresponding positions in the two messages are compared to each other. The resulting bit for the XOR of each pair of corresponding bits is a "0" if the two bits are the same and a "1" if the two bits are different. Table I shows a truth table for a bitwise XOR function for a pair of one bit messages A and B, each of which can take on the possible values of "1" or "0".

TABLE I

| A | B | A XOR B |
|---|---|---------|
| 1 | 0 | 1 |
| 0 | 1 | 1 |
| 0 | 0 | 0 |
| 1 | 1 | 0 |

For messages having more than one bit, the operation is performed on pairs of corresponding bits from each message. For example, Table II illustrates the XOR of the four bit message A=1 0 0 1 with the four-bit message B=0 1 1 1 to produce the four-bit check packet C.

TABLE II

| A = | 1 0 0 1 |
|---|---|
| B = | 0 1 1 1 |
| A XOR B = C = | 1 1 1 0 |

It is a property of the XOR operation that if A XOR B=C, B=C XOR A and A=C XOR B. Furthermore. Where N−1 message packets are XOR'ed together to produce a check packet, e.g., $A_1$ XOR $A_2$ XOR ... XOR $A_{N-1}$ XOR $A_N$=C, one can generally determine any one unknown message packet through a XOR of the other N−1 message packets and the check packet.

Since packets are dropped at random it is likely that two or more message packets may be lost for any given set of message packets. Forward error correction protocols typically generate a number of check packets to be sent from a node to its children. Generally, if there are N message packets in a static message, the nodes at each level forward (1+ε)N check packets to the next level, where ε is less than one. Fortunately, it is generally possible to generate an arbitrarily large number of check packets from randomly selected message packets.

Usually, the number of message packets selected for the purpose of generating the check packets is based on probability. Furthermore, the degree of the XOR operation used the nodes generate the check packets is chosen based on probability. As used herein the degree of a XOR operation refers to the number of elements (e.g., message packets) that are XOR'ed together.

Examples of such techniques are described e.g., in U.S. Pat. No. 6,307,487, which is incorporated herein by reference. Unfortunately, forward error correction of this type has not been applied to streaming media multicasts. The above problems are further compounded for streaming media since new message packets are being generated in a continuous stream. Thus, at any given instant in time, the nodes at each level do not have information regarding all of the packets in the multicast since an undefined number of packets will be generated in the future. Instead nodes at each level only have information regarding those message packets they have already received and no information regarding new message packets still being generated. Thus, when conventional forward error correction is applied to streaming media multicasts, check packets sent from one node may arrive too late to be useful for decoding missing message packets at another node.

Thus, there is a need in the art, for a forward error correction scheme that overcomes the above disadvantages.

SUMMARY OF THE INVENTION

To overcome the above disadvantages, embodiments of the invention are directed to forward error correction in a network.

According to an embodiment, forward error correction may be implemented in a network having first, second and third nodes. The second node receives a first set of streaming media message packets and one or more check packets from an upstream first node. The second node transmits the first set of streaming media message packets and one or more check packets to a downstream third node. The second node generates zero or more decoded packets corresponding to zero or more streaming media message packets missing from the first set using one or more of the check packets. The second node transmits the decoded packets to the third node before the missing message packets are to be presented by the third node.

According to another embodiment, the third node may receive the first set of streaming media message packets and a first set of one or more check packets from the second node, which is upstream of the third node. The third node may also receive a second set of one or more check packets from the first node, which is upstream of the second node. The third node generates zero or more decoded packets corresponding to zero or more streaming media message packets missing from the first set of streaming media message packets using one or more of the check packets.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
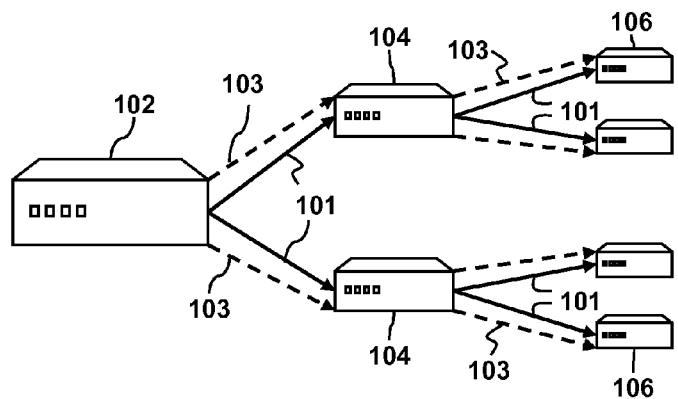
FIG. 1 is a schematic diagram illustrating an example of forward error correction in a streaming media multicast according to an embodiment of the present invention.

Embodiments of the present invention apply forward error correction (FEC) to streaming media. As used herein, the term streaming media refers to electronic messages generated in a continuous stream as in a video or audio broadcast as opposed to being generated as static message packets. Streaming media may be distinguished from static media as follows. With static media, the content of an entire static media message is known at the time a message packet is sent. With streaming media, the content of an entire message (or broadcast) is not known since content is still being generated at the time a streaming media message packet is sent. FIG. 1 is a schematic diagram illustrating an example of forward error correction in a streaming media multicast according to an embodiment of the present invention. A first level node 102, sometimes referred to as a publisher, generates streaming media message packets 101 and check packets 103. The message packets 101 are transmitted to one or more second level nodes 104. Each of the second level nodes 104, in turn transmits the message packets 101 and check packets 103 received from the first level node 102 on to one or more third level nodes 106. The use of a tree topology as shown in FIG. 1 relaxes bandwidth requirements on publishers. In embodiments of the invention it is possible for a given node at any level to receive data from two or more upstream nodes.

The following terminology is used herein to describe the relationship between nodes at a given level and those nodes at a level from which they receive or to which they transmit streaming media message packets 101 and check packets 103. With respect to FIG. 1, the level 2 nodes 104 are said to be downstream of the level 1 node 102. Similarly the level 3 nodes 106 are downstream of the level 1 and level 2 nodes 102, 104. Conversely, the level 1 nodes 102 are said to be upstream of the level 2 nodes 104 and the level 1 and level 2 nodes 102, 104 are said to be upstream of the level 3 nodes 106.

A node is said to be a parent to the node(s) immediately downstream and a child to the node(s) immediately upstream. The level 1 node 102 is said to be a parent of the level 2 nodes 104 and a grandparent to the level 3 nodes 106. The level 2 nodes 104 are said to be children of the level 1 node 102 and parents to the level 3 nodes 106. Finally, the level 3 node 106 is said to be a grandchild to the level 1 node 102.

Check packets are generated using known message packets and are used to decode missing message packets 103. As used herein, "decoding missing packets" refers to the process of constructing a message packet from one or more check packets, or one or more check packets and one or more known message packets. A parent node sends new check packets to its children in a continuous fashion as new message packets are generated or received. In the case of a tree multicast as depicted in FIG. 1, check packets 103 are sent from a parent node to all of its child nodes. For example, the first level node 102 generates and sends check packets 103 to the second level nodes 104 and the second level nodes send check packets 103 to the third level nodes 106.

Check packets 103 received at a given node can be saved and sent to that node's children downstream. If there is an unsatisfied dependency for level 1 node 102, the level 2 nodes 104 may be able to decode missing message packets using saved check packets sent from level 1. It is noted that nodes at different levels do not present streaming data, e.g., for viewing or listening at the same time. A fixed latency typically exists between parent presentation time and child presentation time. This latency provides a window of time during which forward check packets 103 from the level 1 node 102 can be used to correct errors in streaming media packets received by the level 3 nodes 106.

As check packets 103 arrive at the nodes at a given level, those nodes try to decode as many missing message packets as possible. Between every child and its parent there are two independent streams of packets. One stream sends the message packets 101. Another sends check packets 103. The second level nodes 104 can increase bandwidth and send more check packets 103 to its children (the third level nodes 106) based on the errors it has received from its parent (the first level node 102). Because there are an almost limitless number of possible combinations of message packets that can be used to generate check packets, a give node can create an arbitrarily large number of check packets. As a result, the third level nodes 106 may be protected from network loss occurring between the level 1 node 102 and the level 2 nodes 104.

In principal, an infinite number of check blocks could be generated. In practice, the number of check blocks that can be generated may be finite. Typically, an explicit list of message blocks is not transmitted with the check block. More commonly, the internal state of a pseudo-random number generator used to calculate the random message blocks is transmitted. The receiver (e.g., level 2 node 104) uses the exact same pseudo-random number generator algorithm and "seeds" the random number generator with the exact same state used by the sender (e.g., level 1 node 102). The receiver can then calculate the exact same message blocks as the sender. The number of unique check blocks is thus determined by the random number generator used, specifically, the number of unique initial seeds the generator will accept. Simple random number generators usually allow a 32-bit or 64-bit seeds. A 32-bit seed can provide 4,294,967,296 unique check packets, while a 64-bit seed can provide 18,446,744,073,709,551,616 unique check packets.

Generating check packets is not computationally free. Thus it makes sense, and is generally preferable, to reuse the check packet computation from the parent and forward the check packets received from upstream to nodes downstream. However, there are circumstances when an intermediate node may decide it needs to generate new check packets (for example, when a node is increasing the bandwidth devoted to check packets). Thus a given node may generate new check packets in addition to or as an alternative to reusing check packets received from upstream nodes.

Figure 2:
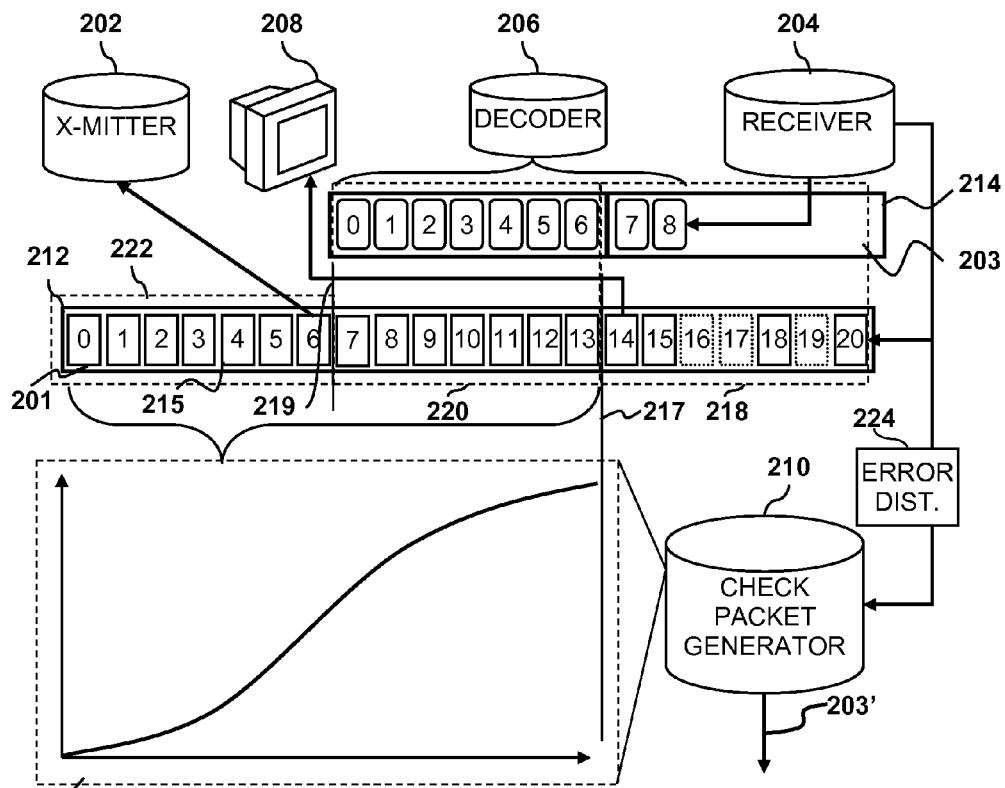
FIG. 2 is a schematic diagram illustrating a buffer in a node implementing forward error correction of streaming media according to an embodiment of the present invention.

FIG. 2 is a schematic diagram illustrating an example of an apparatus 200 implementing forward error correction (FEC) of streaming media according to an embodiment of the present invention. The apparatus 200 may be regarded as a node or a sub-unit of a larger device that serves as a node in a network. The apparatus 200 generally includes a transmitter 202, a receiver 204, a decoder 206, a presentation device 208 and a check packet generator. These components may be implemented in software or hardware or some combination of both.

The transmitter 202 sends transmits media message packets 201 and check packets 203 to other nodes downstream. As used herein, transmission is the process of transmitting data from one or more senders to one or more recipients through a channel in order to deliver a message. Transmission may be regarded as the act of moving data from a sender to a recipient over a channel connecting the sender and recipient. The channel could be a real-time channel, where the channel moves data from the sender to the recipient as the channel gets the data, or the channel might be a storage channel that stores some or all of the data in its transit from the sender to the recipient.

The receiver 204 receives streaming media message packets 201 and check packets 203 from other nodes upstream. The message packets 201 and check packets 203 may be stored in first and second buffers 212, 214 respectively. Message packets in the first buffer 212 are submitted to the presentation device 208 as a frame 215 and sent to the transmitter for transmission to nodes downstream. Check packets 203 in the second buffer 214 may be decoded by the decoder 206 and/or transmitted to nodes downstream by the transmitter 202. The message packets that make up the frame 215 are stored in the first buffer 212 for some period of time (referred to as a buffer length) before being presented by the presentation device. Generally, the packets are stored until the first buffer 212 is full. Similarly, the check packets in the second buffer 214 are stored until the second buffer 214 is full.

In FIG. 2, message packets to the left of a presentation line 217 (e.g., message packets 0-13) have been submitted to the presentation device 208. Message packets 201 in the first buffer 212 to the right of the presentation line 217 (e.g., message packets 14-20) have yet to be presented by the presentation device 208 or transmitted downstream by the transmitter 202. Messages packets and check packets to the left of a transmission line 219 (e.g., message packets 0-6) have been transmitted by the transmitter to nodes downstream and those to the right of the transmission line (e.g., message packets 7-20 and check packets 0-8) have not.

The presentation device 208 presents content derived from the message packets 201 to an audience. The content may be in the form of video images or audible sounds. In the case of video images, the presentation device 208 may include a video monitor and circuitry or software suitable for translating the message packets 201 into a series of video frames that are presented sequentially on the monitor. In the case of audible sounds the presentation device 208 may include one or more audio speakers and circuitry or software suitable for translating the message packets 201 into a series of audio signals that are played sequentially on the speakers.

Some of the message packets 201 may have been randomly dropped between transmission from an upstream node and their arrival at the receiver 204, creating gaps in the first buffer 212. If these gaps can be filled before the frame 215 must be presented, the content presented by the presentation device 208 is not interrupted. To fill these gaps, the decoder 206 decodes missing message packets using one or more of the check packets 203. In general, the check packets 203 may correspond to logical combinations of one or more message packets 201. For example, a check packet may correspond to a particular message packet or to a bit-wise logical combination of two or more message packets. In a preferred embodiment, the logical combination is a bit-wise Exclusive OR (XOR) of one or more message packets 201. The check packets 203 typically include file headers containing information that identifies which message packets 201 they are derived from.

For a sufficiently large number of N message packets 201, Forward Error Correction can generate an infinite number of check packets 203. In general, a node upstream from the apparatus creates as many check packets 203 as possible and sends them to the receiver 204. The decoder 206 can reconstruct all N message packets 201 if it receives any $(1+\epsilon)N$ check packets ($\epsilon \ll 1$). Typically the value of $\epsilon$ is between about 0.05 and about 0.2. Thus for each frame of N message packets the apparatus preferably receives between about 5% and about 20% more than N check packets 203 from the node upstream. Note that since the network channel that carries the check packets 203 may also be subjected to losses in transmission, the upstream node sending the check packets 203 has to send more than $(1+\epsilon)N$ check packets 203 in order to assure that $(1+\epsilon)N$ of them arrive at the receiver 204.

As set forth above, it is possible for the decoder 206 to decode a particular message packet 201 from the check packets 203 by performing XOR operations on the check packets 203 and (optionally) one or more message packets 201. For example check packet 1 may be the XOR of message packets 14 and 16, check packet 2 may be message packet 17 and check packet 3 may be the XOR of message packets 17 and 19. If the apparatus 200 receives message packets 14, 15, 18 and 20, but fails to receive message packets 16, 17, and 19, the latter message packets may be decoded using check packets 1, 2 and 3 as follows.

Check Packet 1=(Message Packet 14)XOR(Message Packet 16)

Check Packet 2=(Message Packet 17)

Check Packet 3=(Message Packet 17)XOR(Message Packet 19)

From the first equation it can be seen that since message packet 14 is known, message packet 16 can be decoded from message packet 14 and check packet 1 as follows:

Message Packet 16=(Check Packet 1)XOR(Message Packet 14)

From the second equation, Message packet 17 can be decoded directly from check packet 2. One may alternatively view check packet 2 as being the XOR of message packet 17 with message packet 17. Since message packet 17 has been decoded, it can be used to determine missing message packet 19 as follows:

Message Packet 19=(Check Packet 3)XOR(Message Packet 17).

According to embodiments of the present invention, a streaming FEC protocol may divide the buffers 212, 214 into two sections, one for message and/or check packets sent to children and one for message/check packets sent to grandchildren. For example, the first and second buffers 212, 214 may be divided into three buffer portions: (1) a first portion 218 to the right of the presentation line 217 containing message and check packets being received from a parent node upstream; (2) a second portion 220 between the presentation line 217 and transmission line 219 containing message and check packets for streaming to children; and (3) a third portion 222 containing older message packets may be saved to correct errors in transmission to grandchildren of the apparatus 200.

By way of example, the check packet generator 210 may use message packets in the second and third portions 220, 222 to generate downstream check packets 203' to be sent downstream to grandchildren of the apparatus 200 via the transmitter 202. Although in principle, the check packet generator 210 could use message packets from the first portion 218 to generate the downstream check packets 203' these message blocks may be so far in the future, that the child node hasn't even started to buffer them yet. Thus, blocks from the first portion 218 may be more or less useless to the child node. More preferably, communication between a parent and child involves information about blocks the child is currently buffering, or past blocks used to heal grandchildren.

As described above, the check packet generator 210 may generate the downstream check packets 203' by performing Exclusive-OR operations on combinations of one or more randomly chosen message packets and identifying in a packet header which message packets were used to generate the downstream check packet 203'. To generate check packets 203' with a high probability of being useful to downstream nodes it is important that the check packet generator follow a specific probability distribution 211 when choosing message packets 201 that are used to create the downstream check packets 203'. Preferably, the probability distribution 211 is weighted toward choosing more recent packets, i.e., packets further to the right of the transmission line 219. For example, in FIG. 2, message packets 11, 12 and 13 are more likely to be selected than message packets 0, 1, 2. Examples of probability distributions for selecting message packets for use in encoding check packets are set forth in U.S. Pat. No. 6,307,487.

The number of message packets 201 used to generate a downstream check packet 203' is also important and must follow a specific probability distribution. In general, this distribution favors check packets generated from smaller numbers of message packets 201. An example of such a distribution would be one in which a single message packet is used 50% of the time, two packets are used 25% of the time, 3 packets are used 17% of the time, four packets are used 5% of the time and five packets are used 3% of the time. With such a distribution roughly half the check packets are single randomly chosen message packets.

Embodiments of the present invention can adapt the probability distribution 211 to adjust for changing network conditions. For example, the apparatus 200 may be notified by a node downstream that message packets 201 sent by the apparatus are being lost with a certain pattern. Such notification may arrive in the form of an error distribution 224. The check packet generator 210 may use the information in the error distribution 224 to alter the probability distribution 211 to select more message packets that are known to have been dropped.

Figure 3:
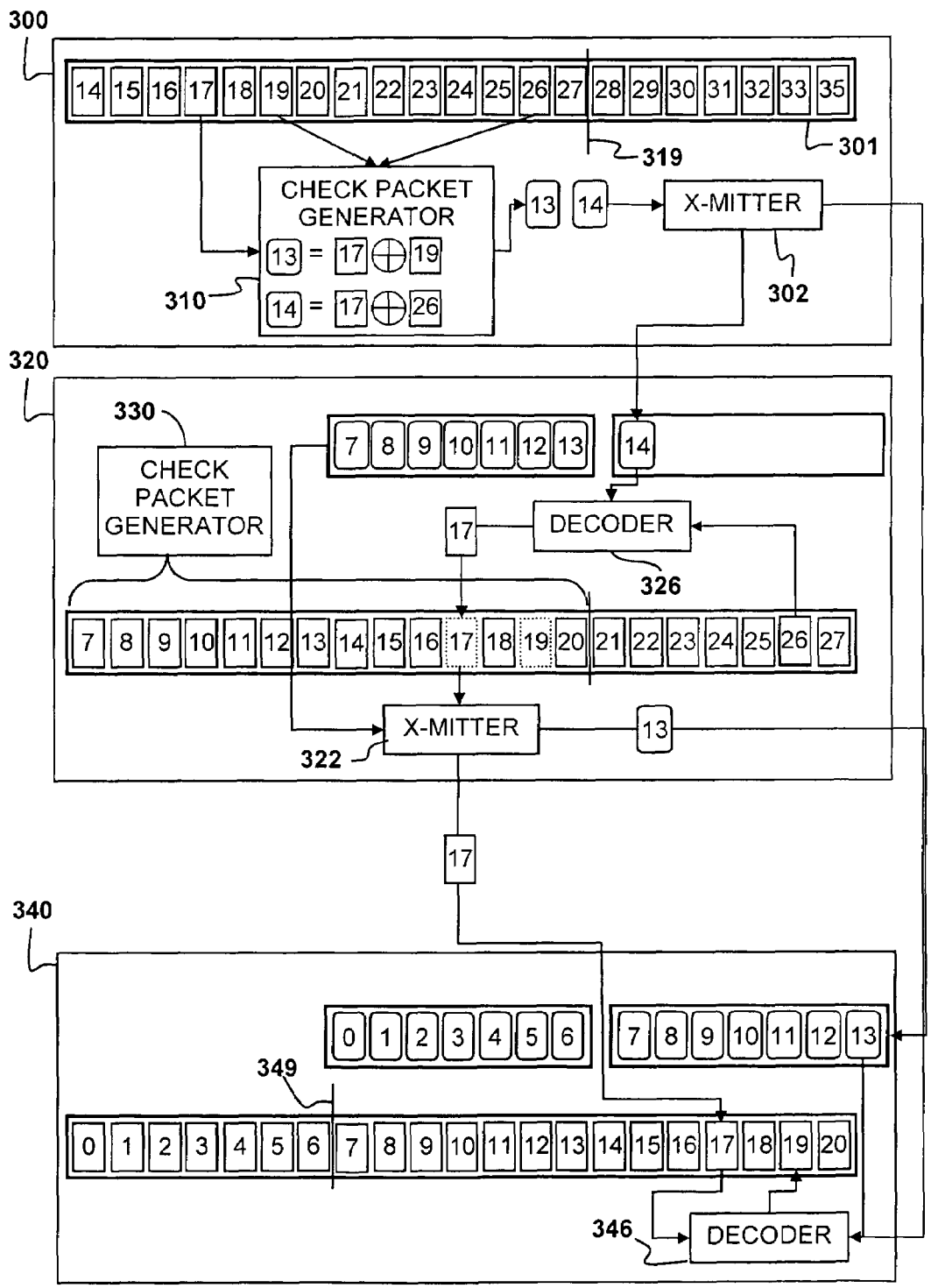
FIG. 3 is a schematic diagram illustrating forward error correction of streaming media according to embodiments of the present invention.

FIG. 3 illustrates schematically how forward error correction of streaming media according to embodiments of the present invention. A first level node 300 transmits streaming media data packets 301 to a second level node 320 using a transmitter 302. In the first level node 300, message packets 0, 1, 2, 3, 4, 5, 6, 7, 8, 9, 10, 11, 12, 13, 14, 15, 16, 17, 18, 19, 20, 21, 22, 23, 24, 25, 26 and 27 have been presented and transmitted to the second level node as indicated by presentation/transmission line 319. Message packets 28, 29, 30, 31, 32, 33, 34 and 35 have not yet been presented or transmitted.

The second level node 320 has presented message packets 0, 1, 2, 3, 4, 5, 6, 7, 8, 9, 10, 11, 12, 13, 14, 15, 16, 18, and 20 and transmitted them to a third level node 340. The second level node 320 has not yet presented or transmitted message packets 21, 22, 23, 24, 25, 26 and 27. The third level node 340 has presented message packets 0, 1, 2, 3, 4, 5, 6, has received but not yet presented packets 7, 8, 9, 10, 11, 12, 13, 14, 15, 16, 18, and 20, and has not yet received any of the other message packets. The check packet generator 310 in the first level node has generated check packets 0, 1, 2, 3, 4, 5, 6, 7, 8, 9, 10, 11, 12, and 13, all of which have been transmitted to the second level node 320 and which the second level node has transmitted to the third level node 340. In some embodiments of the invention, the first level node 300 may generate some check packets from message packets that have already been sent to the second level node 320, e.g., check packet and 13, directly to the third level node 340.

In this example, network congestion prevented a decoder 326 on the second level node 320 from decoding message packets 17 and 19 before they were needed for presentation, resulting in display anomalies. The second level node 320 does have partial knowledge of message packets 17 and 19 from check packet 13, which is the XOR of message packets 17 and 19. Meanwhile, before, the third level node 340 presents message packet 19, a check packet generator 310 in the first level node 300 randomly combines message packet 19 with message packet 26 in check packet 14. The first level node sends check packet 14 to the second level node 320. The decoder 326 can now decode message packet 19 through the following operation:

Message packet 19=(Check Packet 14)XOR(Message Packet 26)

The second level node 320 transmits message packet 19 to the third level node 340 in due course, e.g., via a transmitter 322. Although the decoding of message packet 19 has come after presentation time for the second level node 320, a decoder 346 in the third level node 340 can now correctly decode message packet 17 before presentation time (indicated by line 349 through the following operation:

Message Packet 17=(Check Packet 13)XOR(Message Packet 19)

Furthermore, the decoder 326 in the second level node 320 may similarly decode message packet 17 so that the second level node 320 will have message packets 17 and 19 available for selection by its packet generator 330 to send on to grandchildren of the second level node 320. Furthermore, since the second level node 320 knows that message packets 17 and 19 were dropped it may signal the first level node 300 to that effect and the first level node may respond by sending check packets generated from these two missing message packets. The first level node 300 may send the resulting check packets directly to the third level node 340.

Figure 4:
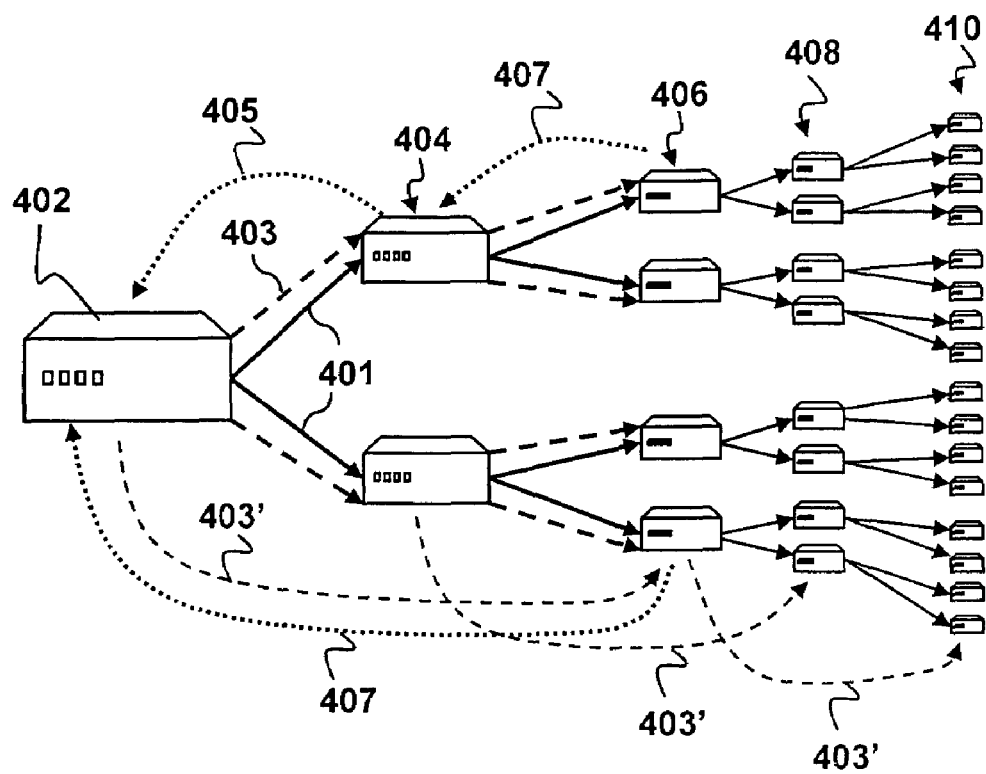
FIG. 4 is a schematic diagram illustrating an example of forward error correction in a streaming media multicast according to an alternative embodiment of the present invention.

The concepts illustrated above with respect to FIG. 3 may be applied to forward error correction in a distribution chain having three or more levels of nodes. FIG. 4 is a schematic diagram illustrating an example of forward error correction in a streaming media multicast according to an alternative embodiment of the present invention. In FIG. 4, a first level node 402 (a publisher) transmits message packets 401 and check packets 403 to two or more second level nodes 404. The second level nodes 404 transmit the message packets 401 and check packets 403 to third level nodes 406, which transmit them to fourth level nodes 408. The fourth level nodes 408, in turn transmit message and check packets to fifth level nodes 410.

Delaying buffers in the nodes at each level all the nodes to heal their children as in a conventional forward error correction. In addition, grandparents can partially heal their grandchildren e.g., as described above with respect to FIG. 3. Furthermore, nodes at each level may send additional check packets 403' directly to their respective grandchildren. Because of the delay in the buffers at each level, the check packets 403' arrive before the grandchildren present the message packets 401 used to generate the additional check packets 403'. Thus, the grandchildren have an opportunity to decode message packets that they might otherwise have missed. As a result, the nodes at all levels experience a relatively constant loss.

It is also noted that downstream nodes can be programmed to recognize patterns in the loss of message packets received from their parents upstream. For example a second level node 404 can profile a pattern of lost data packets in a transmission received from the first level node 402. The second level nodes 404 can report the pattern back to the first level node 402 in an error profile 405. In a similar manner, the third level nodes 406 can provide error profiles 407 back to the second level nodes 404 or to the first level node 402. The first level node 402 can adjust the probability distribution used to generate the check packets 403, 403' sent downstream.

Figure 5:
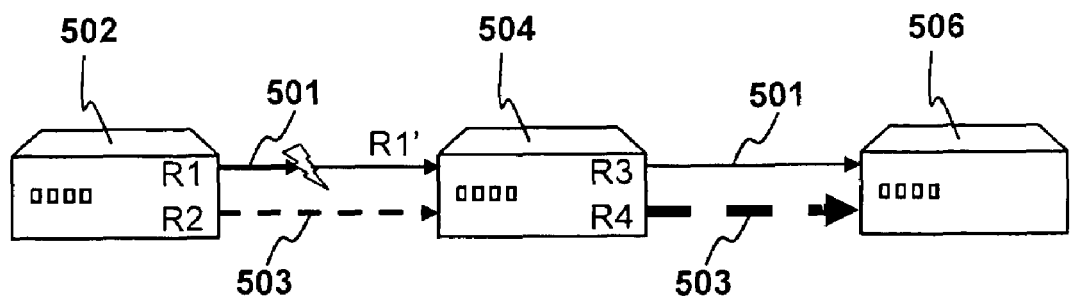
FIG. 5 is a schematic diagram illustrating adjustment of check packet transmission rates in forward error correction of streaming media according to an embodiment of the present invention.

In addition, the upstream nodes may respond in other ways to data lost in transmission to downstream nodes. For example, FIG. 5 is a schematic diagram illustrating adjustment of check packet transmission rates according to an embodiment of the present invention. Usually, a publisher node 502 sends message packets 501 and check packets 503 at a data in two separate data channels to a second level node 504. The message packets are sent at a message packet rate R1 and the check packets are sent at a check packet rate R2. If network loss occurs between the publisher and second level node, the second level node 504 cannot maintain the same message packet rate to its children, e.g., third level node 506. Thus, when network loss occurs between the first level node 502 and the second level node 504 the message packet rate R3 from the second level node to the third level node also drops to R1' as a result. Thus, a drop in the message sending rate of a given node propagates to all of that node's children and grandchildren as well. To compensate for the loss, the second node may be programmed to increase its check packet sending rate to R4, which is greater than R2, to improve resilience to further loss. For example, the first level node 502 and second level node 504 may initially send message packets at 500 kilobytes per second (kps) and check packets at 200 kps. Network loss drops the effective rate (i.e., the rate at which these message arrive at the second level node 504) to 300 kps. The second level node responds by increasing its check packet sending rate R4 to 400 kps. The children and grandchildren of the second level node 504 can also respond by increasing their check packet sending rate to increase resilience.

Embodiments of the present invention may be applied to large scale distribution of real time video or audio over the internet. Embodiments of the present invention provide high loss tolerance suitable for wireless environments. Furthermore, embodiments of the present invention may be applied to live video of events such as sports events or concerts or to live audio transmissions such as internet radio or public addresses. Embodiments of the invention are not limited to tree multicasts. Alternatively, embodiments of the invention may be used in peer-to-peer relay. In addition, nodes at a given level may have multiple parents with different weighted probability distributions.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for forward error correction of streaming media content in a network, the method comprising the steps of:

receiving with a second node a first set of streaming media message packets and one or more check packets from an upstream first node, wherein a node upstream of the first node transmits the streaming media message packets to the first node;

using the second node to transmit the first set of streaming media message packets and one or more check packets to a downstream third node;

generating with the second node zero or more decoded packets corresponding to zero or more streaming media message packets missing from the first set of streaming media message packets using one or more of the check packets;

using the second node to transmit the zero or more decoded packets to the third node before the zero or more streaming media message packets missing from the first set of streaming media message packets are presented by the third node; and receiving at the second node a second set of check packets from the node that is upstream of the first node.

2. The method of claim 1, further comprising the step of:
receiving with the second node a second set of streaming media message packets from the first node;
generating a second set of one or more check packets with the second node using one or more message packets selected at random from the first and second sets.

3. The method of claim 2, further comprising transmitting the second set of check packets with the second node to the third node.

4. The method of claim 2, further comprising transmitting the second set of message packets with the second node to a third node.

5. The method of claim 2 wherein generating a second set of one or more check packets includes using a probability distribution that is weighted toward more recent packets in the second set of message packets to generate the second set of check packets.

6. The method of claim 2 wherein generating the second set of one or more check packets with the second node includes adjusting a rate of generating the check packets in response to an error rate in the first set of streaming media message packets received from the first node.

7. The method of claim 2 wherein generating the second set of check packets includes performing a logical operation involving two or more streaming media message packets received from the first node.

8. The method of claim 7 wherein the logical operation is a bit-wise Exclusive OR operation.

9. The method of claim 1, further comprising the step of generating an error distribution with the second node from errors in the streaming media received from the first node.

10. The method of claim 9 transmitting the error distribution from the second node to the first node.

11. The method of claim 1, further comprising:
with the second node, using the second set of check packets received from the node that is upstream of the first node to decode one or more messages missing from the first set of streaming media message packets received from the first node.

12. The method of claim 1 wherein decoding the decoded packets includes performing a logical operation involving two or more check packets or one or more check packets and one or more streaming media message packets received from the first node.

13. The method of claim 12 wherein the logical operation is a bit-wise Exclusive OR operation.

14. A method for forward error correction of streaming media content in a network, the method comprising the steps of:

receiving with a second node a first set of streaming media message packets and one or more check packets from an upstream first node;

using the second node to transmit the first set of streaming media message packets and one or more check packets to a downstream third node;

generating with the second node zero or more decoded packets corresponding to zero or more streaming media message packets missing from the first set using one or more of the check packets; and using the second node to transmit the zero or more decoded packets to the third node before they are presented by the third node, wherein the third node transmits the first set of streaming media message packets to a fourth node that is downstream of the third node, the method further comprising the step of:

transmitting the one or more check packets from the second node to the fourth node.

15. A method for forward error correction of streaming media content in a network, the method comprising the steps of:

receiving with a second node a first set of streaming media message packets and one or more check packets from an upstream first node;

using the second node to transmit the first set of streaming media message packets and one or more check packets to a downstream third node;

generating with the second node zero or more decoded packets corresponding to zero or more streaming media message packets missing from the first set of streaming media message packets using one or more of the check packets;

using the second node to transmit the zero or more decoded packets to the third node before the zero or more streaming media message packets missing from the first set of streaming media message packets are presented by the third node, wherein the third node transmits the first set of streaming media message packets and one or more check packets to a fourth node;

receiving with the second node a second set of streaming media message packets from the first node;

generating a second set of one or more check packets with the second node using one or more message packets selected at random from the first and second sets; and transmitting the second set of check packets with the second node to the fourth node.

16. A method for forward error correction of streaming media content in a network, the method comprising the steps of:

receiving with a third node a first set of streaming media message packets and a first set of one or more check packets from a second node upstream of the third node;

receiving with the third node a second set of one or more check packets from a first node that is upstream of the second node;

generating with the third node zero or more decoded packets corresponding to zero or more streaming media message packets missing from the first set of streaming media message packets using one or more of the check packets; and with the third node, using one or more check packets from the second set of check packets received from the first node to decode one or more messages missing from the first set of streaming media message packets received from the second node.

17. An apparatus for forward error correction of streaming media in a network, comprising:

a receiver module configured to receive a set of streaming media message packets and a first set of one or more check packets from a second node that is upstream of the apparatus, wherein the receiver module is configured to receive a second set of one or more check packets from a first node that is upstream of the second node;

a decoder module configured to generate zero or more decoded packets corresponding to zero or more message packets missing from the set of streaming media message packets using one or more check packets from the first and second sets.

18. The apparatus of claim 17, further comprising a transmitter module configured to transmit the set of streaming media message packets, the zero or more decoded packets, and one or more check packets from the first or second sets to a third node that is downstream of the apparatus.

19. The apparatus of claim 17 further comprising a buffer for storing streaming media message packets that have been received from the first node and transmitted by the apparatus.

20. The apparatus claim 19, further comprising a check packet generator module configured to generate a third set of one or more check packets using one or more of the streaming media message packets stored in the buffer.

21. The apparatus of claim 20, further comprising a transmitter module configured to transmit the streaming media message packets, the zero or more decoded packets, and one or more check packets from the first or second sets to a third node that is downstream of the apparatus and to a fourth node that is downstream of the third node.

22. The apparatus of claim 21, wherein the transmitter module is further configured to transmit the one or more check packets from the first or second sets to a fourth node that is downstream of the third node.

* * * * *